(12) United States Patent
Noguchi

(10) Patent No.: US 6,772,384 B1
(45) Date of Patent: Aug. 3, 2004

(54) METHOD AND CIRCUIT FOR ERASURE CORRECTION

(75) Inventor: Nobuaki Noguchi, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/496,670

(22) Filed: Feb. 3, 2000

(30) Foreign Application Priority Data

Feb. 5, 1999 (JP) .......................................... 11-029156

(51) Int. Cl.⁷ ........................ H03M 13/29; H03M 13/45
(52) U.S. Cl. ..................................... 714/755; 714/780
(58) Field of Search ................................ 714/755, 780

(56) References Cited

U.S. PATENT DOCUMENTS

| | | | | |
|---|---|---|---|---|
| 4,477,903 A | * | 10/1984 | Schouhamer Immink et al. .......................... | 714/755 |
| 4,483,077 A | | 11/1984 | Matsumoto et al. ...... | 33/125 A |
| 4,665,513 A | * | 5/1987 | Wengler ................... | 369/53.35 |
| 4,683,572 A | * | 7/1987 | Baggen et al. .............. | 714/756 |
| 5,278,846 A | * | 1/1994 | Okayama et al. ........... | 714/755 |
| 5,297,153 A | * | 3/1994 | Baggen et al. .............. | 714/761 |
| 5,311,522 A | * | 5/1994 | Murakami ................... | 360/53 |
| 5,390,195 A | * | 2/1995 | Brush ......................... | 714/778 |
| 5,392,299 A | * | 2/1995 | Rhines et al. ............... | 714/756 |
| 5,450,421 A | * | 9/1995 | Joo et al. .................... | 714/755 |
| 5,463,640 A | * | 10/1995 | Cloetens ..................... | 714/761 |
| 5,623,459 A | * | 4/1997 | Iwamura et al. ............ | 369/126 |
| 5,768,298 A | * | 6/1998 | Nagai et al. ................ | 714/769 |
| 6,029,266 A | * | 2/2000 | Lee ............................. | 714/755 |
| 6,112,324 A | * | 8/2000 | Howe et al. ................ | 707/205 |
| 6,205,568 B1 | | 3/2001 | Kodama .................... | 714/755 |

FOREIGN PATENT DOCUMENTS

| | | |
|---|---|---|
| JP | 3-149923 | 6/1991 |
| JP | 08-23970 | 3/1996 |
| JP | 10-93446 | 4/1998 |
| JP | 10-229344 | 8/1998 |
| KR | 1998-014002 | 5/1998 |
| KR | 1998-071363 | 10/1998 |

* cited by examiner

*Primary Examiner*—Stephen M. Baker
(74) *Attorney, Agent, or Firm*—Wenderoth, Lind & Ponack, L.L.P.

(57) ABSTRACT

A demodulator 101 demodulates modulated data into demodulated data, detects a demodulation error, and sets an erasure flag. An error corrector 104 performs erasure correction for the demodulated data retained in a demodulated data memory 102 by using the erasure flag retained in an erasure flag memory 103. An erasure flag eraser 105 instructs the erasure flag memory 103 to erase an erasure flag which is set to the corrected demodulated data. In this way, the erasure correction which has a higher correction capability and is effective particularly for burst errors is realized.

10 Claims, 4 Drawing Sheets

METHOD AND CIRCUIT FOR ERASURE CORRECTION

FIELD OF THE INVENTION

The present invention relates to an erasure correction method and circuit and, more particularly, to an erasure correction method and circuit for erasure-correcting an error by plural error correcting codes.

BACKGROUND OF THE INVENTION

As a method for improving reliability of a data processing system, error correction technology using an error correcting code having a capability of correcting errors in data is used in various types of data processing apparatus. In recent years, high-density recording to a recording medium, or a high data transfer rate or a high communication speed associated with a data processing apparatus increases error rates in data, and thus a higher correction capability for burst errors is particularly required. Accordingly, plural error correcting codes having higher error correction capabilities are added to data and two-dimensional or three-dimensional error correcting codes are constituted.

FIG. 3 is a diagram for illustrating a structure of a product code as an example of multiply-added error correcting codes. A data processing apparatus divides input data of d0,0, d0,1, d0,2, ..., d1,0, d1,1, ... every (n−s) pieces of data, constitutes a two-dimensional arrangement, and adds parities in each dimensional direction, thereby constituting a product code as shown in FIG. 3. An error correcting code obtained by coding data in a time series direction is referred to as an inner code. The inner code shown in FIG. 3 is a Reed-Solomon code having a code length of n, including (n−s) pieces of data and s parities added thereto. In addition, an error correcting code obtained by coding data which is discrete in a time series direction is referred to as an outer code. The outer code as shown in FIG. 3 is a Reed-Solomon code having a code length of m, including (m−t) pieces of data and t parities attached thereto.

When data having the product code structure as shown in FIG. 3 is reproduced, error correction for the data is usually performed for each inner codeword and subsequently performed for each outer codeword. The data for which the error correction is finished is read in the inner code direction and reproduced.

The erasure correction which is known as an error correction method gives a position of an error beforehand, thereby correcting more data than that in the normal error correction. At the normal error correction of the inner code, errors in (s/2) pieces of data can be corrected. However, when s pieces of data in one codeword include errors and erasure flags are set, and remaining (n−s) pieces of data have no error, errors in s pieces of data can be corrected by the erasure correction. This results from the fact that only the size of the error is required in the erasure correction, while the position and size of the error are required in the normal error correction.

In the case of a Reed-Solomon code, assuming that a code includes f demodulation errors where the erasure flags are set and includes e errors where the erasure flags are not set, when $(f+2e) \leq s$, $(f+e)$ errors can be erasure-corrected.

FIG. 4 is a block diagram illustrating a data processing apparatus utilizing an error correction method disclosed in Japanese Published Patent Application Hei.3-149923.

Data which is input to an input terminal 401 is coded by an outer code parity addition circuit 402 and an inner code parity addition circuit 403, further modulated by a modulation circuit 404, and recorded on a data recorder, i.e., a VTR 405 in this case. When the recorded data is reproduced from the VTR 405, the data output from the VTR 405 is demodulated by a demodulation circuit 406 into demodulated data, and input to an inner code erasure error correction circuit 408 and a symbol delay circuit 409. In addition, it is detected by a symbol pattern check circuit 407 whether the data output from the VTR 405 is a modulation code other than digital demodulation codes defined previously at the modulation time. When the data is other than the defined codes, it is output to the inner code erasure error correction circuit 408 as an erasure flag, as well as the number of erasure flags is counted for each inner codeword by an erasure symbol count circuit 410. In this case, when the number of the erasure flags is smaller than a reference, a switch 411 is switched to A to output data, to which the erasure correction of the inner code is performed, to an inner code error detection correction circuit 412. When the number of the erasure flags is larger than the reference, the switch 411 is switched to B to output data which is delayed by the symbol delay circuit 409. The inner code error detection correction circuit 412 performs the error correction of the inner code, and sets an erasure flag for a codeword which cannot be corrected. An outer code erasure error correction circuit 413 performs the erasure correction by using the erasure flag from the inner code error detection correction circuit 412, and sets an erasure flag for a codeword which cannot be corrected. Finally, a modification circuit 414 modifies data in which the erasure flag is set and errors may remain, and outputs reproduced data.

In the conventional erasure correction method, when errors cannot be corrected in correcting the inner code, the erasure flags are set for all data in the inner code. Therefore, at a time of correcting the outer code, the erasure flags are set also for data which is really correct. For example, when (s+1) erasure flags by the demodulation error are set in the inner code shown in FIG. 3, neither the inner code erasure error correction circuit 408 nor inner code error detection correction circuit 412 can correct errors. Therefore, the erasure flags are set for all the n pieces of data in the inner code. However, many pieces of data which are not erroneous are included therein. That is, the erasure flags are set even for correct data, thereby increasing a possibility that erroneous data cannot be corrected at the correcting time of the outer code and deteriorating the correction capability.

Further, when a burst error occurs, there is a high possibility of the erasure flags in excess of the number s of data which can be erasure-corrected in correcting the inner code being set. In this case, the inner code erasure correction using the erasure flags cannot be performed and the data cannot be corrected by the normal inner code error correction either.

SUMMARY OF THE INVENTION

It is an object of the present invention to improve a correction capability by using a demodulation error as an erasure flag for correcting plural error correcting codes and realize correction processings which are effective for burst errors.

Other objects and advantages of the present invention will become apparent from the detailed description and specific embodiments described are provided only for illustration since various additions and modifications within the spirit and scope of the invention will be apparent to those of skill in the art from the detailed description.

An erasure correction method according to the present invention for erasure-correcting an error by plural error correcting codes comprises steps of: demodulating modulated data into demodulated data having the plural error correcting codes added thereto; setting an erasure flag for a demodulation error at the demodulation time; and reading the demodulated data for each of the plural error correcting codes, and erasure-correcting errors in the demodulated data, including the demodulation error indicated by the erasure flag. Therefore, the erasure correction having a correction capability higher than that of the prior art which uses the demodulation error as an erasure flag only for the erasure correction of an inner code is realized.

The erasure correction method according to the present invention comprises a step of erasing the erasure flag for the demodulated data which is erasure-corrected, for each of the correcting codes, and using an erasure flag which is not erased at the erasure correction by a precedent correction code, thereby performing erasure correction by a subsequent correcting code. Therefore, the erasure flags are not incorrectly set to correct demodulated data and the erasure correction having a higher correction capability is realized.

The erasure correction method according to the present invention comprises a step of initially reading the demodulated data for each codeword of the outer code, thereby performing the erasure correction. Therefore, more errors can be erasure-corrected in data where burst errors are likely to occur.

The erasure correction method according to the present invention comprises steps of: reading the demodulated data for each codeword of the outer code to erasure-correct an error in the demodulated data, and erasing the erasure flag for the corrected demodulated data; and reading the demodulated data for each codeword of the inner code to erasure-correct an error using an erasure flag which is not erased by the outer code, and erasing the erasure flag for the corrected demodulated data. Therefore, the erasure correction having a higher correction capability is realized.

The erasure correction method according to the present invention comprises steps of: reading the demodulated data for each codeword of the inner code to erasure-correct an error in the demodulated data, as well as erasing the erasure flag for the corrected demodulated data; reading the demodulated data for each codeword of the outer code to erasure-correct an error by using an erasure flag which is not erased by the inner code, as well as erasing the erasure flag for the corrected demodulated data; and reading again the demodulated data for each codeword of the inner code to erasure-correct an error using an erasure flag which is not erased by the outer code, as well as erasing the erasure flag for the corrected demodulated data. Therefore, more errors can be erasure-corrected in data where burst errors are likely to occur.

The erasure correction method according to the present invention comprises a step of performing the erasure correction by the correcting codes at least once before performing the erasure correction using the erasure flag, a after performing the erasure correction, or before and after the erasure correction. Therefore, the erasure correction having a further higher correction capability is realized.

An erasure correction circuit according to the present invention for erasure-correcting an error by plural error correcting codes comprises: a demodulator for demodulating modulated data into demodulated data having the plural error correcting codes added thereto, as well as detecting a demodulation error and setting an erasure flag; a demodulated data memory for retaining the demodulated data; an erasure flag memory for retaining the erasure flag; an error corrector for erasure-correcting errors in demodulated data which is read from the demodulated data memory, including the demodulation error indicated by the erasure flag, as well as outputting error position information of corrected demodulated data; and an erasure flag eraser for receiving the error position information, and instructing the erasure flag memory to erase the erasure flag for the corrected demodulated data. Therefore, the erasure correction having a correction capability higher than that of the prior art which uses the demodulation error as an erasure flag only for the erasure correction of an inner code is realized.

In the erasure correction circuit of the present invention, the error corrector reads the demodulated data for each of the error correcting codes to perform the correction; the erasure flag eraser instructs the erasure of the erasure flag for each of the correcting codes; and the error corrector uses an erasure flag which is not erased at the correction processing by a precedent correcting code, thereby erasure-correcting an error at a correction processing by a subsequent correcting code. Therefore, the erasure flags are not incorrectly set to correct demodulated data and the erasure correction having a higher correction capability is realized.

In the erasure correction circuit of the present invention, the error corrector initially reads the demodulated data for each codeword of the outer code, thereby performing the erasure correction. Therefore, more errors can be erasure-corrected in data where burst errors are likely to occur.

In the erasure correction circuit of the present invention, the error corrector reads the demodulated data for each codeword of the inner code after the initial erasure correction by the outer code, and erasure-corrects an error using an erasure flag which is not erased at the erasure correction by the outer code. Therefore, the erasure correction having a further higher correction capability is realized.

In the erasure correction circuit of the present invention, the error corrector initially reads the demodulated data for each codeword of the inner code to perform erasure correction, thereafter reads the demodulated data for each codeword of the outer code to erasure-correct an error using an erasure flag which is not erased at the erasure correction by the inner code, and reads again the demodulated data for each codeword of the inner code to erasure-correct an error using an erasure flag which is not erased at the erasure correction by the outer code. Therefore, more errors can be erasure-corrected in data where burst errors are likely to occur.

In the erasure correction circuit of the present invention, the error corrector performs the erasure correction by the correcting codes, at least once before performing the erasure correction using the erasure flag, after performing the erasure correction, or before and after the erasure correction. Therefore, the erasure correction having a further higher correction capability is realized.

DETAILED DESCRIPTION OF THE PREFERRED EMBODIMENTS

Hereinafter, an embodiment of the present invention will be described with reference to the drawings.

Figure 1:
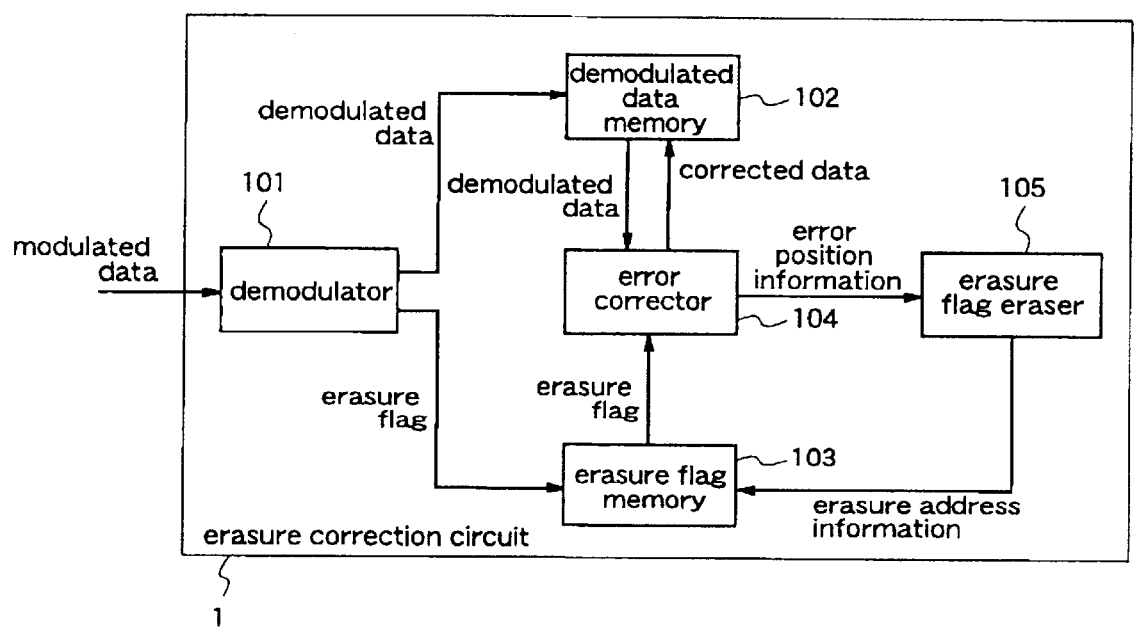
FIG. 1 is a block diagram illustrating a structure of an erasure correction circuit 1.

FIG. 1 is a block diagram illustrating a structure of an erasure correction circuit 1 realizing an erasure correction method according to this embodiment.

The erasure correction circuit 1 comprises a demodulator 101, a demodulated data memory 102, an erasure flag memory 103, an error corrector 104, and an erasure flag eraser 105.

The demodulator 101 converts modulated data reproduced from a recording medium or received from a communication medium into demodulated data having plural error correcting codes added thereto, and outputs the demodulated data to the demodulated data memory 102, as well as detects a demodulation error, and outputs an erasure flag to the erasure flag memory 103. More specifically, the demodulator 101 demodulates modulated data which is modulated from 8 bits into 16 bits, into 8 bits. In this case, when the 16-bit modulated data does not exist in digital modulation codes which are defined beforehand at the modulation time, the data cannot be demodulated correctly and therefore this data is judged as a demodulation error. The demodulated data judged as the demodulation error is assured that it is surely erroneous. Therefore, it is effective in the error correction method to output the demodulation error as an erasure flag and utilize the erasure flag for the erasure correction. Here, the numbers of bits comprising the modulated data and the demodulated data are not limited to the numbers shown above as an example. In addition, as an example of errors in the demodulated data other than the demodulation error, there is an error resulting from erroneous data that is transmitted as correct data by mistake although the modulated data is erroneous, because data corresponding to the erroneous data exists accidentally in the previously defined digital modulation codes.

The demodulated data memory 102 retains the demodulated data from the demodulator 101.

The erasure flag memory 103 retains the erasure flag from the demodulator 101.

The error corrector 104 reads the demodulated data from the demodulated data memory 102 and the erasure flag from the erasure flag memory 103 to perform an arithmetic of erasure correction, erasure-corrects the error in the demodulated data, writes corrected data onto the demodulated data memory 102, and outputs error position information in the corrected data to the erasure flag eraser 105. Here, the error corrector 104 corrects not only the demodulation error indicated by the erasure flag but errors of data where the erasure flag is not set, within its correction capability.

The erasure flag eraser 105 outputs address information of the erasure flag to the erasure flag memory 103 so as to erase the erasure flag which is set for the demodulated data indicated by the error position information which is output by the error corrector 104, and instructs erasure of the erasure flag.

The demodulated data including the corrected data written on the demodulated data memory 102 is properly output to the outside (not shown).

It is preferable to perform the erasure correction at least once for each error correcting code. The number of times that the error corrector 104 performs the erasure correction can be adjusted in consideration of an error rate or processing time for data.

An operation of the erasure correction in the above structure will be described, taking a product code comprising two error correcting codes, i.e., an inner code and an outer code as examples of plural error correcting codes.

Figure 2:
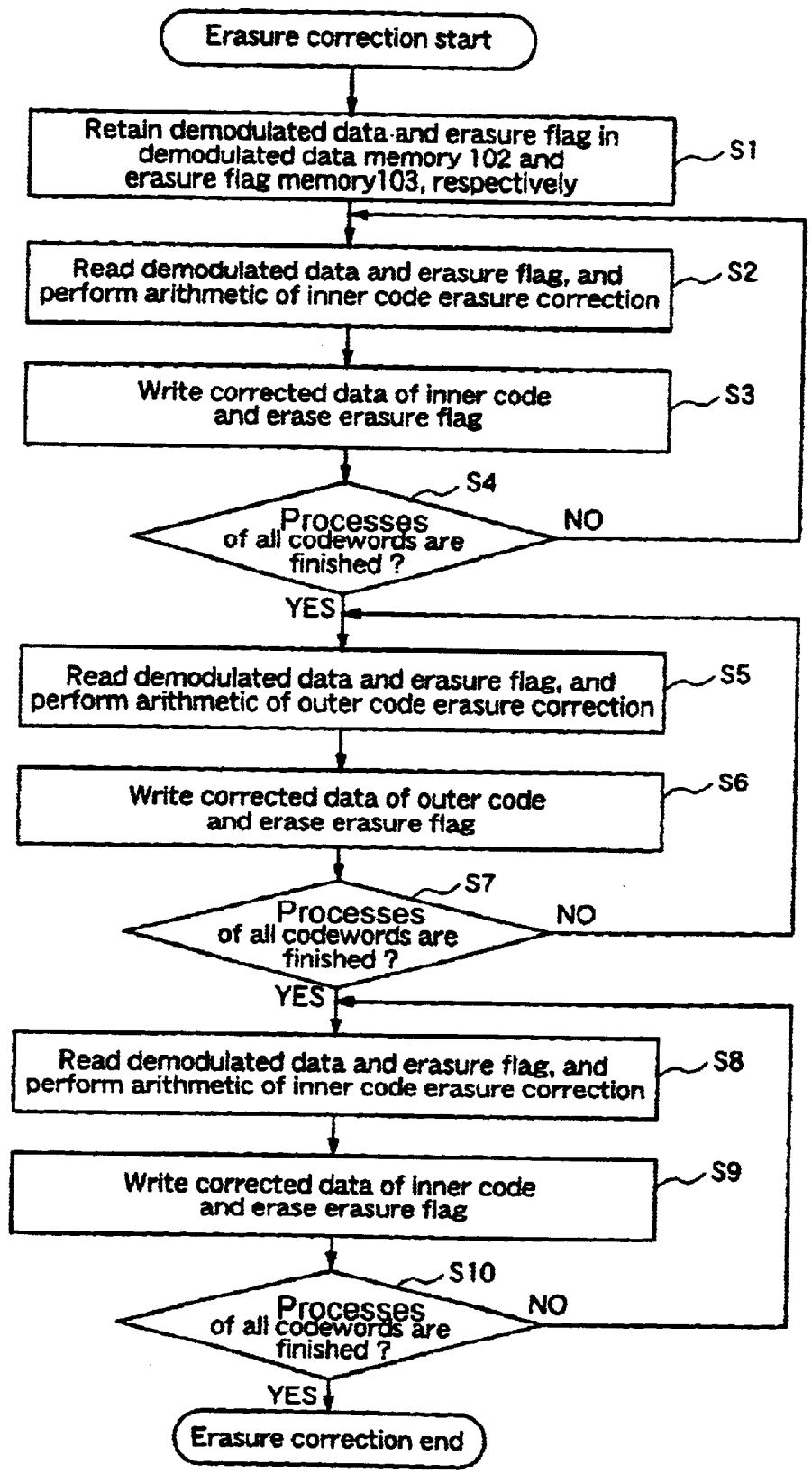
FIG. 2 is a flowchart for explaining erasure correction according to an embodiment of the present invention.
Figure 3:
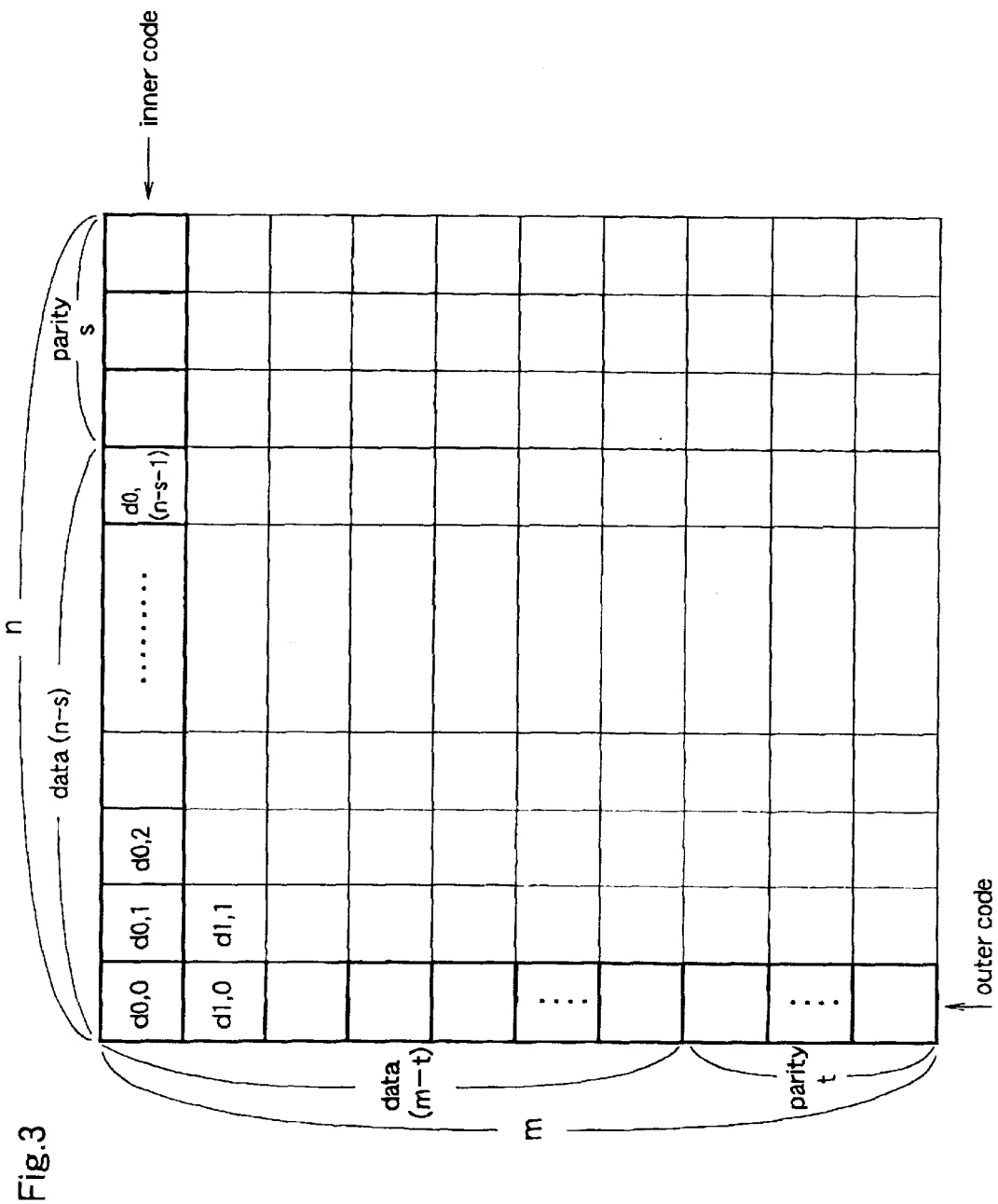
FIG. 3 is a diagram illustrating a structure of a product code, as an example of multiply-added error correcting codes.
Figure 4:
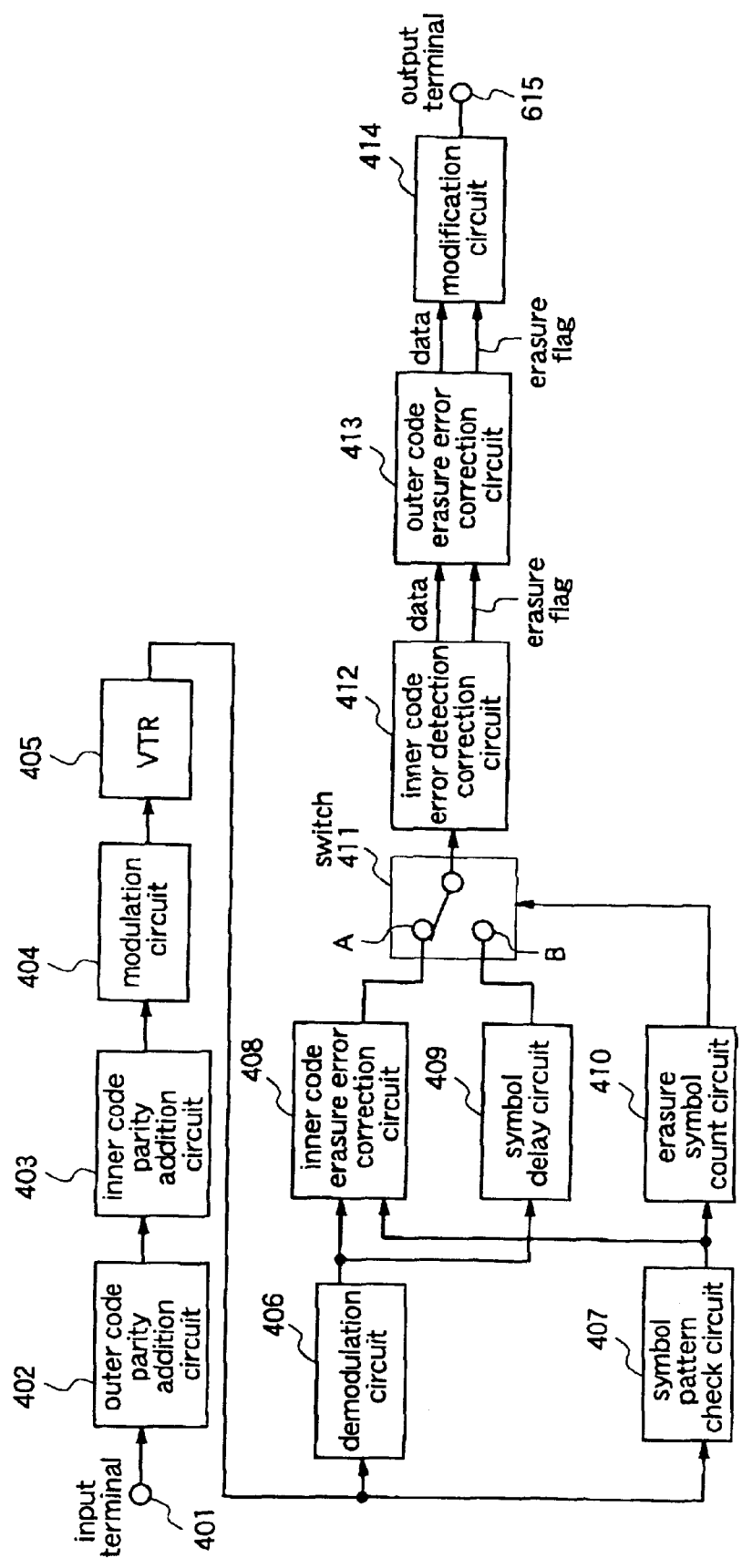
FIG. 4 is a block diagram illustrating a data processor using a conventional error correction method.

FIG. 2 is a flowchart for explaining the erasure correction in a case where the data is corrected by reading the product code shown in FIG. 3 three times in the order of the inner code, the outer code, and the inner code.

In step S1, the demodulated data memory 102 retains demodulated data which is demodulated by the demodulator 101, and the erasure flag memory 103 retains an erasure flag indicating a demodulation error in the demodulator 101.

In step S2, the error corrector 104 reads demodulated data from the demodulated data memory 102 for each inner codeword, reads an erasure flag corresponding to the read demodulated data from the erasure flag memory 103, and performs an arithmetic of the erasure correction for each inner codeword.

In step S3, the error corrector 104 writes corrected data onto the demodulated data memory 102 as well as transmits error position information which is obtained by the arithmetic of the erasure correction to the erasure flag eraser 105. The erasure flag eraser 105 transmits the address of the erasure flag retained in the erasure flag memory 103 corresponding to the corrected data, to the erasure flag memory 103, as erasure address information. The erasure flag memory 103 erases the erasure flag of the address indicated by the erasure address information.

In step S4, it is checked whether the processes in steps S2 and S3 are performed to all codewords of the inner code. When the processes are finished for all the inner codewords (YES), it proceeds to step S5 and correction of the outer code is started. When they are not finished (NO), it returns to step S2.

In step S5, the error corrector 104 reads demodulated data from the demodulated data memory 102 for each outer codeword, then reads an erasure flag corresponding to the read demodulated data from the erasure flag memory 103, and performs arithmetic of erasure correction for each outer codeword.

In step S6, the error corrector 104 writes corrected data onto the demodulated data memory 102 as well as transmits error position information which is obtained by the arithmetic of erasure correction to the erasure flag eraser 105. The erasure flag eraser 105 transmits the address of an erasure flag retained in the erasure flag memory 103, corresponding to the corrected data, to the erasure flag memory 103 as erasure address information. The erasure flag memory 103 erases the erasure flag having the address indicated by the erasure address information.

In step S7, it is confirmed whether the processes in steps S5 and S6 are performed for all codewords of the outer code. When the processes are completed for all the outer codewords (YES), it proceeds to step S8 and the correction of the inner code is started again. When they are not completed (NO), it returns to step S5.

In step S8, as similar to step S2, the error corrector 104 reads demodulated data from the demodulated data memory 102 for each inner codeword, then reads an erasure flag corresponding to the read demodulated data from the erasure flag memory 103, and performs the arithmetic of erasure correction for each inner codeword.

In step S9, as similar to step S3, the error corrector 104 writes corrected data onto the demodulated data memory 102 as well as erases an erasure flag retained in the erasure flag memory 103.

In step S10, it is confirmed whether the processes in steps S8 and S9 are performed for all codewords of the inner code. When the processes are completed for all the inner codewords (YES), the operation of the erasure correction is, finished, and when it is not completed (NO), it returns to step S8.

As described above, in this embodiment, the demodulation error is used as an erasure flag for the erasure correction by plural error correcting codes, for example the outer code and the inner code. Therefore, the erasure correction having a higher correction capability can be realized with relation to the prior art which uses the demodulation error as an erasure flag only for the erasure correction by the inner code.

Further, in this embodiment, the erasure flag for the corrected demodulated data is erased and, in the following erasure correction, the erasure correction is performed on the basis of remaining erasure flags. Therefore, an erasure flag is not set erroneously to correct demodulated data and the erasure correction having a higher correction capability is realized.

Errors in the demodulated data are divided broadly into a random error which has a short length irrelevant to the time series, and a burst error which occurs extending for a long period in the time series. Since the inner code is coded in the time series direction, when a burst error occurs, the number of erroneous demodulated data often exceeds the number of demodulated data which can be erasure-corrected. On the other hand, the outer code is obtained by coding demodulated data which is discrete in the time series direction. Therefore, even when a burst error occurs, the number of errors in each outer code can be suppressed.

Therefore, an erasure correction circuit which can erasure-correct more errors in data where burst errors are likely to occur can be obtained by controlling the error corrector 104 in the erasure correction circuit 1 to initially read data for each outer codeword to perform the correction processing.

For example, the erasure correction can be performed by reading demodulated data for each outer codeword to erasure-correct a demodulation error, thereafter reading demodulated data for each inner codeword, and erasure-correcting errors using erasure flags which are not erased by the correction by the outer code.

In addition, even when the erasure correction is performed by initially reading demodulated data for each inner code as described above, the correction capability for the burst errors is improved by performing the erasure correction by the inner code again after performing the erasure correction by the outer code.

It is apparent that the same effects as those described above can be obtained also in cases where one memory is commonly used as the demodulated data memory and the erasure flag memory, or an individual error corrector is provided for each code.

In addition, an erasure correction circuit or method having a further higher correction capability is realized by performing the erasure correction with correcting codes at least once, before performing the erasure correction using an erasure flag, after performing the erasure correction, or before and after the erasure correction.

In this embodiment, the description is given taking two correcting codes of an inner code and an outer code as an example of the plural error correcting codes. However, the number of the error correcting codes is not limited to 2. Needless to say, the present invention can be applied also in the case of three or more correcting codes.

What is claimed is:

1. An erasure correction method for correcting an error by using plural different types of error correcting codes said method comprising:

demodulating modulated data into demodulated data having the plural different types of error correcting codes added thereto;

setting an erasure flag for a demodulation error at the demodulation time;

reading the demodulated data for each of the plural different types of error correcting codes, and erasure-correcting errors in the demodulated data including the demodulation error indicated by the erasure flag;

erasing the erasure flag for the demodulated data which is erasure-corrected for each of the correcting codes and using an erasure flag which is not erased at the correction by a precedent correction code for performing erasure-correction by a subsequent correcting code, wherein the demodulated data having the plural different types of the error correcting codes added thereto includes a product code comprising an outer code and an inner code;

reading the demodulated data for each codeword of the inner code to erasure-correct an error in the demodulated data, as well as erasing the erasure flag for the corrected demodulated data;

reading the demodulated data for each codeword of the outer code to erasure-correct an error by using an erasure flag which is not erased by the inner code, as well as erasing the erasure flag for the corrected demodulated data; and reading again the demodulated data for each codeword of the inner code to erasure-correct an error using an erasure flag which is not erased by the outer code, as well as erasing the erasure flag for the corrected demodulated data.

2. An erasure correction method for correcting an error by using plural different types of error correcting codes, said method comprising:

demodulating modulated data into demodulated data having the plural different types of error correcting codes added thereto;

setting an erasure flag for a demodulation error at the demodulation time;

reading the demodulated data for each of the plural different types of error correcting codes, and erasure-correcting errors in the demodulated data including the demodulation error indicated by the erasure flag; and erasing the erasure flag for the demodulated data which is erasure-corrected for each of the correcting codes and using an erasure flag which is not erased at the correction by a precedent correction code for performing erasure-correction by a subsequent correcting code, wherein the erasure correction is performed to the demodulated data at least once for each of the plural different types of the error correcting codes, and wherein the demodulated data having the plural different types of the error correcting codes added thereto includes a product code comprising an outer code and an inner code;

initially reading the demodulated data for each codeword of the outer code to perform the erasure correction;

reading the demodulated data for each codeword of the outer code to erasure-correct an error in the demodulated data, and erasing the erasure flag for the corrected demodulated data; and reading the demodulated data for each codeword of the inner code to erasure-correct an error using an erasure flag which is not erased by the outer code, and erasing the erasure flag for the corrected demodulated data.

3. An erasure correction method for correcting an error by using plural different types of error correcting codes, said method comprising:

demodulating modulated data into demodulated data having the plural different types of error correcting codes added thereto;

setting an erasure flag for a demodulation error at the demodulation time;

reading the demodulated data for each of the plural different types of error correcting codes, and erasure-correcting errors in the demodulated data including the demodulation error indicated by the erasure flag; and erasing the erasure flag for the demodulated data which is erasure-corrected for each of the correcting codes and using an erasure flag which is not erased at the correction by a precedent correction code for performing erasure-correction by a subsequent correcting code, wherein the erasure correction is performed to the demodulated data at least once for each of the plural different types of the error correcting codes, and wherein the demodulated data having the plural different types of the error correcting codes added thereto includes a product code comprising an outer code and an inner code;

reading the demodulated data for each codeword of the inner code to erasure-correct an error in the demodulated data, as well as erasing the erasure flag for the corrected demodulated data;

reading the demodulated data for each codeword of the outer code to erasure-correct an error using an erasure flag which is not erased by the inner code, as well as erasing the erasure flag for the corrected demodulated data; and reading again the demodulated data for each codeword of the inner code to erasure-correct an error using an erasure flag which is not erased by the outer code, as well as erasing the erasure flag for the corrected demodulated data.

4. An erasure correction method for correcting an error by using plural different types of error correcting codes, said method comprising:

demodulating modulated data into demodulated data having the plural different types of error correcting codes added thereto;

setting an erasure flag for a demodulation error at the demodulation time;

reading the demodulated data for each of the plural different types of error correcting codes, and erasure-correcting errors in the demodulated data including the demodulation error indicated by the erasure flag; and erasing the erasure flag for the demodulated data which is erasure-corrected for each of the correcting codes and using an erasure flag which is not erased at the correction by a precedent correction code for performing erasure-correction by a subsequent correcting code, wherein the erasure correction is performed to the demodulated data at least once for each of the plural different types of the error correcting codes; and performing the erasure correction using the correction codes at least once before performing the erasure correction using the erasure flag, after performing the erasure correction, or before and after the erasure correction.

5. An erasure correction circuit for erasure correcting an error by using plural error correcting codes, said circuit comprising:

a demodulator operable to demodulate modulated data into demodulated data having the plural error correcting codes added thereto, as well as detect a demodulation error and set an erasure flag;

a demodulated data memory operable to retain the demodulated data;

an erasure flag memory operable to retain the erasure flag;

an error corrector operable to erasure-correct errors in the demodulated data which is read from said demodulated data memory, including the demodulation error indicated by the erasure flag, as well as output error position information of the corrected demodulated data; and an erasure flag eraser operable to receive the error position information, and instruct said erasure flag memory to erase the erasure flag for the corrected demodulated data, wherein said error corrector is operable to read the demodulated data for each of the error correcting codes to perform the correction, wherein said erasure flag eraser is operable to instruct the erasure of the erasure flag for each of the correcting codes, wherein said error corrector is operable to use an erasure flag which is not erased at the correction processing by a precedent correcting code for erasure correcting an error at a correction processing by a subsequent correcting code, wherein the demodulated data includes a product code comprising an outer code and an inner code, wherein said error corrector is operable to initially read the demodulated data for each codeword of the outer code when performing the erasure correction, and wherein said error corrector is operable to read the demodulated data for each codeword of the inner code after the initial erasure correction by the outer code, and erasure correct an error using an erasure flag which is not erased at the erasure correction by the outer code.

6. An erasure correction circuit for erasure correcting an error by using plural error correcting codes, said circuit comprising:

a demodulator operable to demodulate modulated data into demodulated data having the plural error correcting codes added thereto, as well as detect a demodulation error and set an erasure flag;

a demodulated data memory operable to retain the demodulated data;

an erasure flag memory operable to retain the erasure flag;

an error corrector operable to erasure-correct errors in the demodulated data which is read from said demodulated data memory, including the demodulation error indicated by the erasure flag, as well as output error position information of the corrected demodulated data; and an erasure flag eraser operable to receive the error position information, and instruct said erasure flag memory to erase the erasure flag for the corrected demodulated data, wherein said error corrector is operable to read the demodulated data for each of the error correcting codes to perform the correction, wherein said erasure flag eraser is operable to instruct the erasure of the erasure flag for each of the correcting codes, wherein said error corrector is operable to use an erasure flag which is not erased at the correction processing by a precedent correcting code for erasure correcting an error at a correction processing by a subsequent correcting code, wherein the demodulated data includes a product code comprising an outer code and an inner code, and wherein said error corrector is operable to initially read the demodulated data for each codeword of the inner code to perform the erasure correction, thereafter read the demodulated data for each codeword of the outer code to erasure correct an error using an erasure flag which is not erased at the erasure correction by the inner code, and read again the demodulated data for each codeword of the inner code to erasure correct an error using an erasure flag which is not erased at the erasure correction by the outer code.

7. An erasure correction circuit for erasure correcting an error by using plural error correcting codes, said circuit comprising:

a demodulator operable to demodulate modulated data into demodulated data having the plural error correcting codes added thereto, as well as detect a demodulation error and set an erasure flag;

a demodulated data memory operable to retain the demodulated data;

an erasure flag memory operable to retain the erasure flag;

an error corrector operable to erasure-correct errors in the demodulated data which is read from said demodulated data memory including the demodulation error indicated by the erasure flag, as well as output error position information of the corrected demodulated data; and an erasure flag eraser operable to receive the error position information and instruct said erasure flag memory to erase the erasure flag for the corrected demodulated data, wherein said error corrector is operable to read the demodulated data for each of the error correcting codes to perform the correction, wherein said erasure flag eraser is operable to instruct the erasure of the erasure flag for each of the correcting codes, wherein said error corrector is operable to use an erasure flag which is not erased at the correction processing by a precedent correcting code for erasure correcting an error at a correction processing by a subsequent correcting code, and wherein said error corrector is operable to perform the erasure correction by the correcting codes, at least once before performing the erasure correction using the erasure flag, after performing the erasure correction, or before and after the erasure correction.

8. An erasure correction circuit for erasure correcting an error by using plural error correcting codes said circuit comprising:

a demodulator operable to demodulate modulated data into demodulated data having the plural error correcting codes added thereto as well as detect a demodulation error and set an erasure flag;

a demodulated data memory operable to retain the demodulated data;

an erasure flag memory operable to retain the erasure flag;

an error corrector operable to erasure-correct errors in the demodulated data which is read from said demodulated data memory, including the demodulation error indicated by the erasure flag, as well as output error position information of the corrected demodulated data; and an erasure flag eraser operable to receive the error position information, and instruct said erasure flag memory to erase the erasure flag for the corrected demodulated data, wherein said error corrector is operable to read the demodulated data for each of the error correcting codes to perform the correction, wherein said erasure flag eraser is operable to instruct the erasure of the erasure flag for each of the correcting codes, wherein said error corrector is operable to use an erasure flag which is not erased at the correction processing by a precedent correcting code for erasure correcting an error at a correction processing by a subsequent correcting code, wherein the demodulated data includes a product code comprising an outer code and an inner code, wherein said error corrector is operable to initially read the demodulated data for each codeword of the outer code to perform the erasure correction, and wherein said error corrector is operable to read the demodulated data for each codeword of the inner code after the initial erasure correction by the outer code, and erasure correct an error using an erasure flag which is not erased at the erasure correction by the outer code.

9. An erasure correction circuit for erasure correcting an error by using plural error correcting codes, said circuit comprising:

a demodulator operable to demodulate modulated data into demodulated data having the plural error correcting codes added thereto, as well as detect a demodulation error and set an erasure flag;

a demodulated data memory operable to retain the demodulated data;

an erasure flag memory operable to retain the erasure flag;

an error corrector operable to erasure-correct errors in the demodulated data which is read from said demodulated data memory, including the demodulation error indicated by the erasure flag, as well as output error position information of the corrected demodulated data; and an erasure flag eraser operable to receive the error position information, and instruct said erasure flag memory to erase the erasure flag for the corrected demodulated data, wherein said error corrector is operable to read the demodulated data for each of the error correcting codes to perform the correction, wherein said erasure flag eraser is operable to instruct the erasure of the erasure flag for each of the correcting codes, wherein said error corrector is operable to use an erasure flag which is not erased at the correction processing by a precedent correcting code for erasure correcting an error at a correction processing by a subsequent correcting code, wherein the demodulated data includes a product code comprising an outer code and an inner code, and wherein said error corrector is operable to initially read the demodulated data for each codeword of the inner code to perform the erasure correction, thereafter read the demodulated data for each codeword of the outer code to erasure correct an error using an erasure flag which is not erased at the erasure correction by the inner code, and read again the demodulated data for each codeword of the inner code to erasure correct an error using an erasure flag which is not erased at the erasure correction by the outer code.

10. An erasure correction circuit for erasure correcting an error by using plural error correcting codes, said circuit comprising:

a demodulator operable to demodulate modulated data into demodulated data having the plural error correcting codes added thereto, as well as detect a demodulation error and set an erasure flag;

a demodulated data memory operable to retain the demodulated data;

an erasure flay memory operable to retain the erasure flag;

an error corrector operable to erasure-correct errors in the demodulated data which is read from said demodulated data memory, including the demodulation error indicated by the erasure flag, as well as output error position information of the corrected demodulated data; and an erasure flag eraser operable to receive the error position information, and instruct said erasure flag memory to erase the erasure flag for the corrected demodulated data, wherein said error corrector is operable to read the demodulated data for each of the error correcting codes to perform the correction, wherein said erasure flag eraser is operable to instruct the erasure of the erasure flag for each of the correcting codes, wherein said error corrector is operable to use an erasure flag which is not erased at the correction processing by a precedent correcting code for erasure correcting an error at a correction processing by a subsequent correcting code, wherein said error corrector is operable to perform the erasure correction to the demodulated data at least once for each of the plural error correcting codes, and wherein said error corrector is operable to perform the erasure correction by the correcting codes, at least once before performing the erasure correction using the erasure flag, after performing the erasure correction, or before and after the erasure correction.

* * * * *